United States Patent
Fushimi

[19]

[11] Patent Number: 6,049,039
[45] Date of Patent: Apr. 11, 2000

[54] TERMINAL AND A METHOD OF FORMING THE SAME

[75] Inventor: Isao Fushimi, Shizuoka, Japan

[73] Assignee: Star Micronics Co., Ltd., Shizuoka, Japan

[21] Appl. No.: 08/976,574

[22] Filed: Nov. 24, 1997

Related U.S. Application Data

[63] Continuation of application No. 08/438,932, May 10, 1995, abandoned.

[30] Foreign Application Priority Data

May 18, 1994 [JP] Japan ................................. 6-128237

[51] Int. Cl.$^7$ ............................... H05K 7/10; H01B 5/02; H01R 9/09
[52] U.S. Cl. ...................... 174/68.1; 361/774; 439/45; 439/46; 439/75; 439/84; 439/751; 174/267
[58] Field of Search ........................... 174/68.1, 261, 174/267; 361/760, 784, 791, 773, 774; 439/45, 46, 75, 82, 84, 751; 164/3, 6; 29/33 M, 747

[56] References Cited

U.S. PATENT DOCUMENTS 5,373,110  12/1994  Inasaka .................................. 174/267

FOREIGN PATENT DOCUMENTS 2281767  9/1979  Germany ................................. 361/760
2820002  11/1979  Germany ................................. 174/267

*Primary Examiner*—Hyung-Sub Sough
*Attorney, Agent, or Firm*—Pollock, Vande Sande & Amernick

[57] ABSTRACT

A printed circuit terminal includes a main terminal body and an integrally formed fixing portion that is coaxial with the terminal body for mounting the terminal to a printed circuit base member. A frusto-conical flange is integrally connected between the body and the fixing portion and has a peripheral surface located in radially outward relation to the body and the fixing portion. The flange includes two surface portions. The first surface portion is adapted to contact and extend from the base member for receiving solder deposited in electrical contact with the base member. A second surface portion is axially adjacent to the first portion and exposes a different surface material than the first portion in order to restrain solder adhesion to the second surface portion.

21 Claims, 20 Drawing Sheets

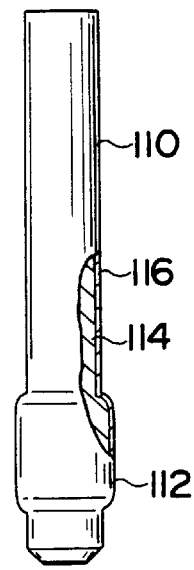
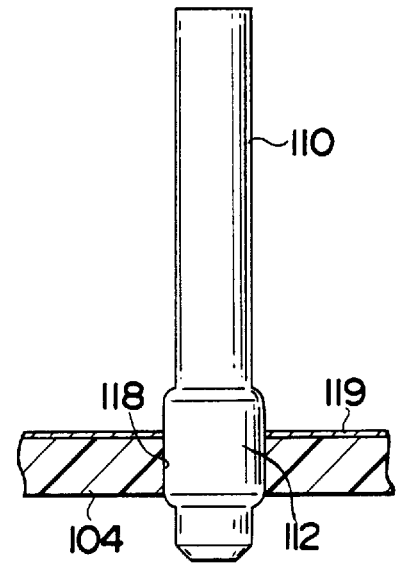
FIG. 11A
PRIOR ART
FIG. 11B
PRIOR ART
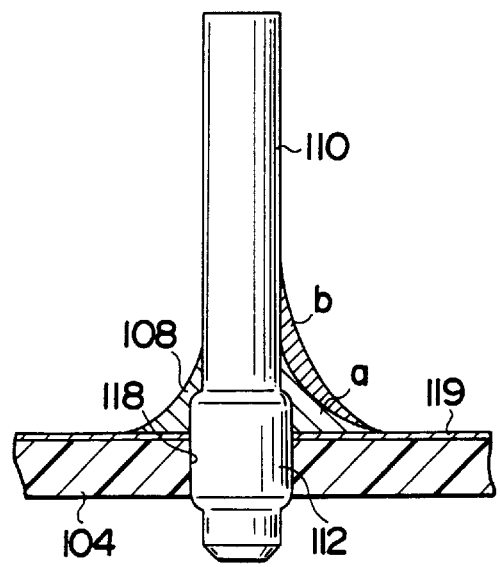
FIG. 11C
PRIOR ART

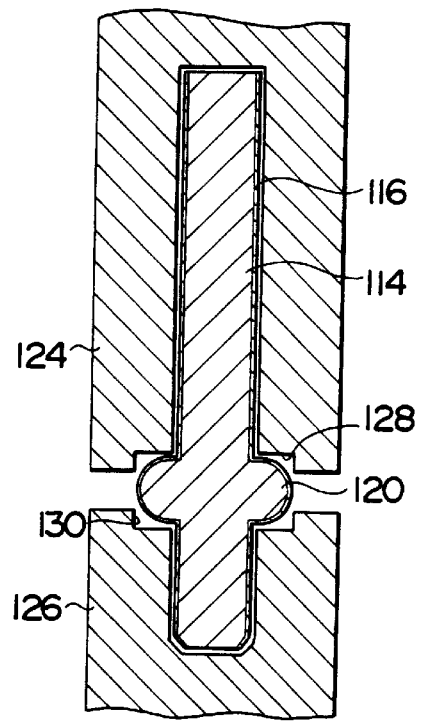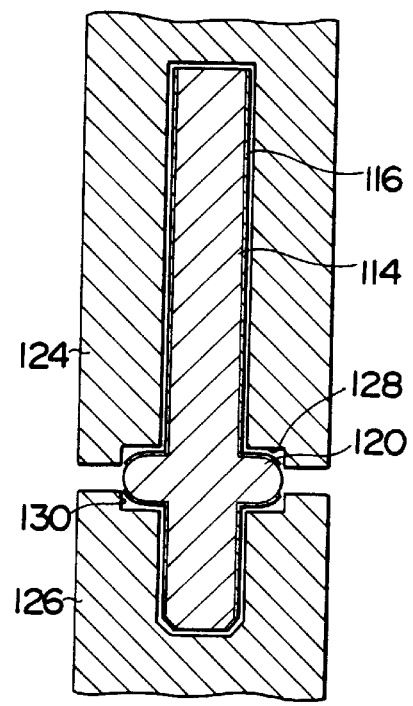
FIG. 13A
PRIOR ART
FIG. 13B
PRIOR ART

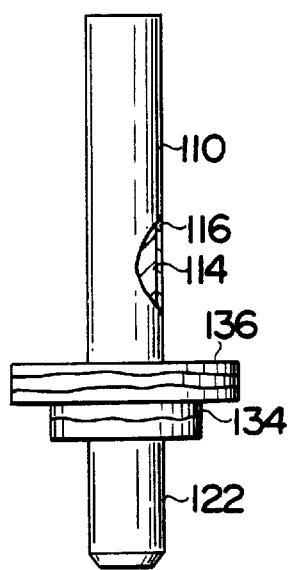
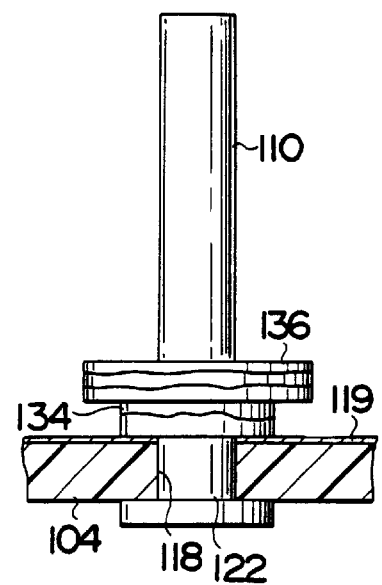
FIG 14A
PRIOR ART
FIG. 14B
PRIOR ART
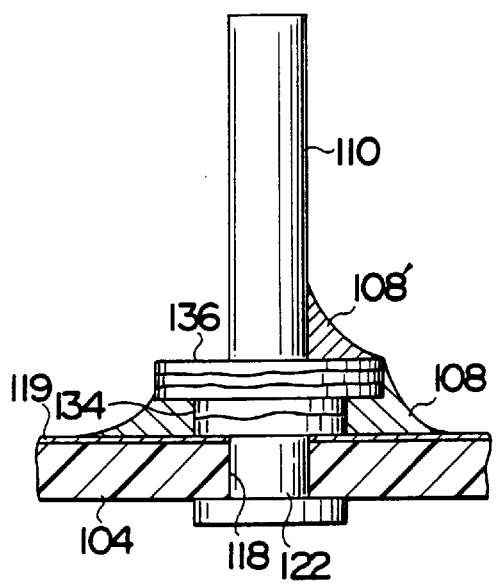
FIG. 14C
PRIOR ART

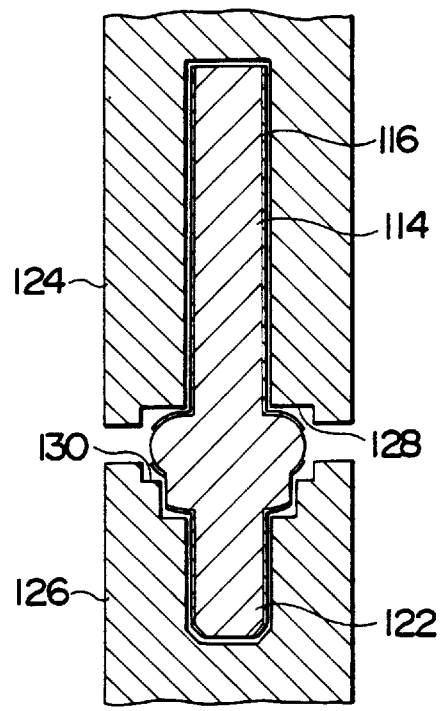 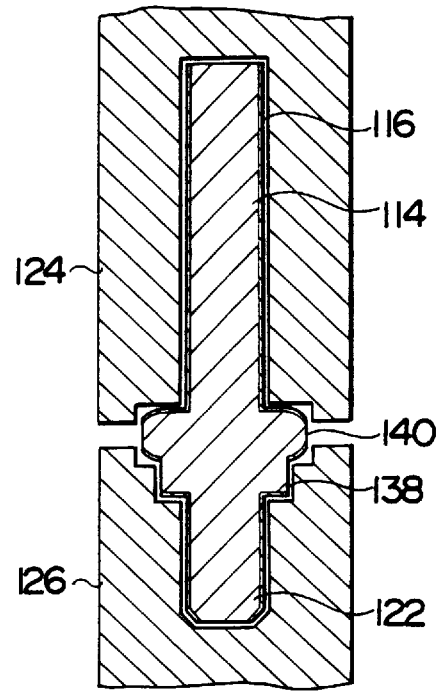
FIG. 15A
PRIOR ART
FIG. 15B
PRIOR ART

TERMINAL AND A METHOD OF FORMING THE SAME

This application is a continuation of U.S. patent application Ser. No. 08/438,932, filed May 10, 1995, now abandoned.

BACKGROUND OF THE INVENTION

1. Field of the Invention

The present invention relates to a terminal used for various electric and electronic devices such as an electroacoustic transducer and parts thereof and a method of forming the same.

2. Description of the Prior Art

FIG. 10 shows the structure of a terminal of a general electroacoustic transducer. This electroacoustic transducer is used for a buzzer, etc. and includes an outer casing 102 and a printed board 104 installed therein. A pair of terminals 106 are fixed to the printed board 104 and they are individually electrically connected to a wiring conductor on the printed board 104 by way of solder 108. Each terminal 106 forms an input terminal through which an ac signal etc. is applied to the electroacoustic transducer to drive the same.

For example, a terminal as shown in FIG. 11A has been used as each terminal 106 so far. This terminal includes a columnar terminal body 110, a large diameter portion 112 formed on the terminal body 110 adjacent to a rear end thereof and a conductive plating layer 116 formed on the surface of a base material 114 thereof. The large diameter portion 112 is forced into a through hole 118 formed on the printed board 104 and fixed thereto as shown in FIG. 11B. A conductive pattern 119 is formed on the surface of the printed board 104, and the terminal body 110 and the conductive pattern 119 are electrically connected to each other by way of the solder 108 as shown in FIG. 11C. However, the solder 108 flows over a region denoted at a to a region as denoted at b, which sometimes forms a solder fillet. Formation of such a solder fillet enlarges a solder adhering portion over a region which is extremely unstable in area depending on temperature, characteristic of a soldering iron, an operator's skill, etc., to cause the deterioration of quality of a product and the prevention of thinning the same such as the electroacoustic transducer, etc. This also narrows a possible soldering region for connection to an external device on the terminal body 110. Such a terminal is inserted into the through hole 118 of the printed board 104 and fixed thereto at the large diameter portion 112 alone, which causes such inconvenience that it is low in fixing strength between the printed board 104 and itself to be inferior in reliability.

A terminal as shown in FIG. 12A includes the terminal body 110 having a flange 120 and a fixing portion 122 thereunder. This terminal also has the conductive plated layer 116 on the surface of the base material 114 thereof. As shown in FIG. 12B, such a terminal is fixed to the printed board 104 in such a way that firstly the fixing portion 122 is inserted into the printed board 104, secondly the terminal body 110 is positioned perpendicular with respect to the printed board 104 by way of the flange 120, thirdly the end of the fixing portion 122 is crushed to fix the terminal body 110 to the printed board 104, and finally the terminal body 110 and printed board 104 are fixedly connected to each other by the solder 108. The terminal having the flange 120 has such effects that it is easily positioned and has high fixing strength with respect to the printed board 104. Even in case of such a terminal, however, when it is subjected to soldering using a soldering iron, a solder 108' flows over the peripheral surface of the flange 120 to adhere to the upper surface of the same at the terminal body 110 side to form a solder fillet there as shown in FIG. 12C. Such solder 108' is unnecessary and also causes deterioration of the product, prevents the product from being thinned and reduces the solder 108 at a portion where soldering is essentially necessary.

Such adhesion of the solder 108' is closely related with the forming process of the terminal. FIG. 13A, FIG. 13B and FIG. 13C show the forming process of a terminal according to a general manufacturing method thereof.

A rod-shaped base material 114 is used for the terminal material and a smooth-surfaced conductive plating layer 116 is formed on the surface thereof. The terminal material is previously cut in a given length in accordance with a mold, then inserted into the molds 124 and 126 and is subjected to a pressure molding process in cavities 128 and 130 of the molds 124 and 126 respectively. The pressure molding process will be described hereinafter sequentially. In a step of FIG. 13A, the compressed base material 114 is swelled in the cavities 128 and 130 to form the flange 120, wherein the molding process is gently performed in this step so that the conductive plating layer 116 is also swelled along the surface of the flange 120. When the molding process advances from the step of FIG. 13A to a step of FIG. 13B, the conductive plating layer 116 in the peripheral surface portion of the flange 120 is cracked to expose the base material 114 thereunder. In a last step as shown in FIG. 13C, an exposed portion 132 of the base material 114 appears on a peripheral wall portion of the flange 120, thereby forming the terminal as shown in FIG. 12A. The surface of the exposed portion 132 of the base material 114 is uneven so that it is inferior in solder wetting.

It is a matter of course that the conductive plating layer 116 is a means to enhance solder wetting performance. A portion where the base material 114 is exposed from the conductive plating layer 116, namely, the exposed portion 132 is extremely reduced in solder wetting performance. As a result, most solder flows toward the solder 108' as shown in FIG. 12C, which causes not only the deterioration of quality but also the connection failure of the solder 108 between the terminal body 110 and the printed board 104.

A terminal as shown in FIG. 14A has been also used as the terminal 106 so far. The terminal of this type has flanges 134 and 136 forming a stepped flange on the terminal body 110. In such a terminal, the conductive plating layer 116 is also formed on the surface of the base material 114. As shown in FIG. 14B, the terminal 106 is fixed to the printed board 104 in such a way that firstly the fixing portion 122 is inserted into the printed board 104, secondly the terminal body 110 is positioned perpendicular with respect to the printed board 104 by way of the flange 134, thirdly the end of the fixing portion 122 is crushed to fix the terminal body 110 to the printed board 104, and finally the terminal body 110 and printed board 104 are fixedly connected to each other by the solder 108. Accordingly, the terminal 106 has such effects that it is easily positioned and firmly fixed to the printed board 104. However, such a terminal also has the same drawbacks as the terminal as shown in FIG. 12 that the solder 108' flows over the peripheral surfaces of the flanges 134 and 136 to adhere to the surface of the flange 136 at the terminal body 110 side. Further, the flanges 134 and 136 constitute a step-structure which increases the thickness of the terminal 106, causing such an inconvenience that the thermal 106 is prevented from being miniaturized.

Such adhesion of the solder 108' is caused by the same reason as that described relating to the terminal of FIG. 12.

FIG. 15A, FIG. 15B and FIG. 15C show the molding processes of the terminal. The terminal material is previously cut in a given length, then inserted into the molds 124 and 126 and is subjected to a pressure molding process in cavities 128 and 130 of the molds 124 and 126 respectively. In each step of the molding process, the compressed base material 114 is swelled in the cavities 128 and 130 to form the flanges 134 and 136, the conductive plating layer 116 on the peripheral surface portion of the flanges 134 and 136 are cracked so as to expose the base material 114 thereunder. Exposed portions 138 and 140 of the base material 114 are lower than the surface of the conductive plating layer 116 in solder wetting performance, so that the solder 108' moves toward a portion having high solder wetting performance as shown in FIG. 14C, which results in reduction of the solder 108 at a necessary soldering portion to lower the adhesive strength.

SUMMARY OF THE INVENTION

It is an object of the present invention to provide a terminal which optimizes a solder adhesion region and increase the reliability of soldering connection and a method of forming the same.

A terminal of the present invention comprises, as shown in FIG. 1A, FIG. 1B and FIG. 1C, a fixing portion 6 for fixing a terminal body 2 to a base member (printed board 20) and a flange 4 to be connected to the base member by solder 28, wherein the flange 4 comprises on a peripheral portion a soldering surface 14 confronting a connecting surface of the base member (conductive pattern 24) and a solder adhesion restraining portion 18 for restraining the solder adhesion region of the soldering surface 14.

The soldering surface of the terminal may be of any form so long as it confronts the connecting surface of the base member, for example, it may be structured by an inclined surface or curved surface formed on the peripheral surface of the flange.

The terminal of the present invention may include a concave portion (annular concave portion 44 in FIG. 4) or a step portion (annular step portion 48 in FIG. 8) formed on the surface of the flange at the terminal body side thereof as a means for preventing the production of a solder fillet.

According to the terminal of the present invention, the solder adhesion restraining portion intends to restrain the adhesion of solder and it may be structured by an uneven surface as the simplest means.

Further, the surface of the solder adhesion restraining portion may be made uneven by peeling off a conductive plating layer 10 formed on the flange 4 to thereby expose a base material 8 thereunder.

A method of forming terminals according to the present invention is characterized in comprising steps of, as shown in FIG. 2, subjecting a base material 8 having a conductive plating layer 10 formed on the surface thereof to pressure molding in molds 30 and 32 so as to integrally form a terminal body, a flange and a fixing portion, forming a soldering surface 14 on the peripheral surface of the flange, and exposing the base material 8 from the conductive plating layer 10 so as to form a solder adhesion restraining portion 18 for restricting a solder adhesion region of the soldering surface 14.

As mentioned above, in the terminal of the present invention, since the fixing portion is formed on the terminal body at one end portion thereof for fixing the terminal body to the base member, and the flange is also formed on the terminal body wherein the soldering surface confronting the connecting surface of the base member and the solder adhesion restraining portion for restraining the solder adhesion region of the soldering surface 14 are respectively formed on the peripheral portion of the flange 4, it is possible to surely flow the solder between the connecting surface of the base member and the soldering surface of the flange, thereby strongly connecting the terminal body to the base member, and it is also possible to uniformly define the solder adhesion region by the solder adhesion restraining portion 18, thereby restraining the production of the solder fillet at an unnecessary soldering portion.

Further, in the terminal of the present invention, since the soldering surface is structured, for example, by an inclined surface or a curved surface formed on the peripheral surface of the flange, it is possible to restrict the solder adhesion region to the soldering surface side being coupled with the solder adhesion restraining portion and it is also possible to surely flow the solder between the connecting surface of the base member and the soldering surface of the flange, thereby enhancing connecting strength.

Still further, in the terminal of the present invention, the provision of the concave and step portion on the surface of the flange at the terminal body side thereof can increase the diameter of the flange measured along the surface thereof to surely prevent the formation of the solder fillet.

Still further, in the terminal of the present invention, it is possible to sufficiently adhere the solder to the soldering surface while surely preventing the adhesion of solder on the solder adhesion restraining portion since the solder adhesion restraining portion is formed of an uneven surface.

Still further, it is possible to easily make the solder adhesion restraining portion uneven by peeling off the conductive plating layer from the base material so as to expose the same, thereby selectively forming a region to which the solder is not adhered.

In a method of forming a terminal of the present invention, it is possible to easily integrally form the terminal body, flange and fixing portion, and it is also possible to form the solder adhesion portion and the solder adhesion restraining portion where the base material is exposed from the conductive plating layer by subjecting the base material coated with the conductive plating layer to pressure molding in the molds.

BRIEF DESCRIPTION OF THE DRAWINGS

FIG. 11A is a partly cross-sectional view showing a prior art terminal;

FIG. 11B is a partly cross-sectional view showing a state where the terminal is fixed to a printed board;

FIG. 11C is a partly cross-sectional view showing a state where the terminal is soldered and connected to the printed board;

FIG. 13A is a cross-sectional view showing an initial process for forming the terminal of FIG. 12A;

FIG. 13B is a cross-sectional view showing a middle forming process for forming the terminal of FIG. 12A;

FIG. 14A is a partly cross-sectional view showing still another prior art terminal;

FIG. 14B is a partly cross-sectional view showing a state where the terminal is fixed to a printed board;

FIG. 14C is a partly cross-sectional view showing a state where the terminal is soldered and connected to the printed board;

FIG. 15A is a cross-sectional view showing an initial process for forming the terminal of FIG. 14A;

FIG. 15B is a cross-sectional view showing a middle forming process for forming the terminal of FIG. 14A.

DETAILED DESCRIPTION OF THE PREFERRED EMBODIMENT

Embodiments of the present invention are now described in detail with reference to attached drawings. Elements which are common to these embodiments are denoted at the same numerals.

Figure 1A:
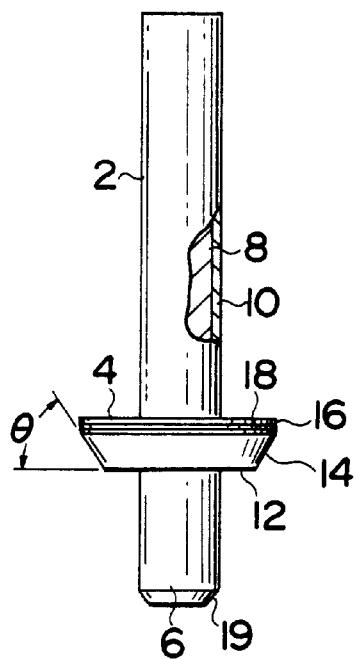
FIG. 1A is a view showing an external appearance of a terminal according to a first embodiment of the present invention.
Figure 1B:
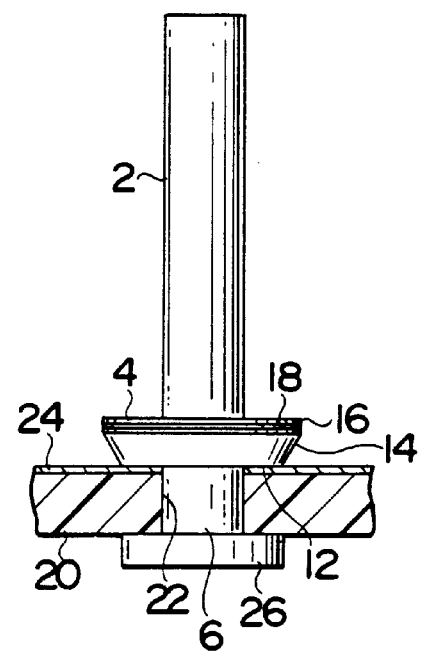
FIG. 1B a partly cross-sectional view showing a state where the terminal is fixed to a printed board.
Figure 1C:
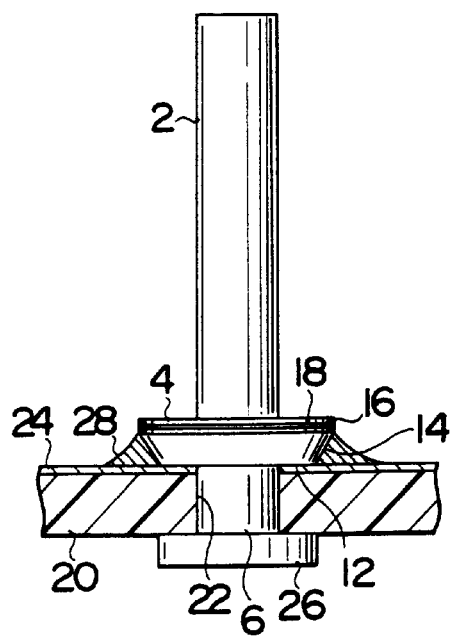
FIG. 1C is a partly cross-sectional view of the terminal to which soldering is performed.

First Embodiment (FIGS. 1 to 3):

FIG. 1A, FIG. 1B and FIG. 1C show a terminal according to a first embodiment of the present invention, wherein FIG. 1A shows an external shape of the terminal, FIG. 1B is a partly cross-sectional view showing a state where the terminal is fixed to a printed board and FIG. 1C is a partly cross-sectional view of the terminal to which soldering is applied.

As shown in FIG. 1A, this terminal includes a terminal body 2, a flange 4 and a fixing portion 6. The terminal body 2 and fixing portion 6 are respectively columnar and have the same diameter. The terminal body 2, flange 4 and fixing portion 6 are integrally formed of the same terminal material. A conductive plating layer 10 made of a conductor having high solder wetting performance such as tin, high-temperature melting solder, etc. is formed on the surface of a base material 8.

The flange 4 includes a flat fixing surface 12 at the side of the fixing portion 6. The flange 4 also includes a soldering surface 14 on the peripheral wall surface thereof, and a large diameter portion 16 having a given width, the soldering surface 14 being inclined from the terminal body 2 side of the flange 4 having a large diameter toward the fixing surface 12 side thereof having a small diameter. Although angle θ between the fixing surface 12 and the soldering surface 14 can be set arbitrarily, it is preferable to be greater than 10 degrees considering the flow, i.e., penetration of the solder therebetween since the soldering surface 14 forms a solder adhesion region.

There is formed a solder adhesion restraining portion 18 on a part of a peripheral surface of the flange 4 for preventing a solder fillet from being formed. The solder adhesion restraining portion 18 is a portion for restricting the adhesion of solder and a means for limiting the solder adhesion region to the side of the soldering surface 14. According to the first embodiment, although the conductive plating layer 10 is formed on the surface of the flange 4 like the terminal body 2 and fixing portion 6, the conductive plating layer 10 is removed from a part of the surface of the flange 4 to forcibly form a part having low solder wetting performance, i.e., the solder adhesion restraining portion 18 on the exposed part of the base material 8. The surface of the solder adhesion restraining portion 18 is rough and uneven compared with other surfaces, so that it is low in solder wetting performance. On the other hand, the soldering surface 14 of the flange 4 is even and high in solder wetting performance. Accordingly, the solder adhesion restraining portion 18 and soldering surface 14 are remarkably differentiated from each other in respect of solder adhesion property, i.e., adhesion force.

A tapered surface 19 is formed on an end portion of the fixing portion 6 for facilitating the insertion of the fixing portion 6 into a base member to which the terminal is to be fixed.

When the terminal is used, a through hole 22 corresponding to the fixing portion 6 is formed through a printed board 20 serving as the base member as shown in FIG. 1B. The fixing portion 6 is inserted into the through hole 22 and the fixing surface 12 of the flange 4 is brought into contact with a conductive pattern 24 of the printed board 20 to which it is to be fixed. The end portion of the fixing portion 6 is crushed at the rear surface side of the printed board 20 so as to form a flange 26 corresponding to the flange 4 while the fixed surface 12 is kept to be brought into contact with the conductive pattern 24. That is, the terminal body 2 is fixed to the printed board 20 by inserting the fixing portion 6 into the through hole 22 of the printed board 20 and then clamping the printed board 20 between the flange 4 and flange 26. Since the fixing surface 12 of the flange 4 is flat, the terminal body 2 is adhered to the printed board 20 perpendicularly thereto if the fixing surface 12 is formed at right angles to the terminal body 2. In this case, the fixing surface 12 of the flange 4 is brought into contact with the conductive pattern 24 of the printed board 20 so that the terminal body 2 and conductive pattern 24 are electrically connected to each other. The fixing surface 12 may be formed of a concave or step surface as well as an even surface. In this case, the fixing surface 12 bites into the conductive pattern 24 of the printed board 20 to mechanically fix and electrically connect the fixing surface 12 to the conductive pattern 24 as well. The conductive pattern 24 is formed of a copper foil, etc. and is adhered to the printed board 20.

When soldering is performed between the soldering surface 14 of the flange 4 and the conductive pattern 24 of the printed board 20 using a soldering iron, etc., solder 28 is adhered between the soldering surface 14 and the conductive pattern 24 while bridging therebetween. In this case, since the soldering surface 14 is even due to the conductive plating layer 10, it has high solder wetting performance so that solder flows into an acute-angled narrow portion formed between the soldering surface 14 and conductive pattern 24 to surely connect the soldering surface 14 and conductive pattern 24 to each other. Since the solder adhesion restraining portion 18 has low solder wetting performance, it prevents the adhesion of the solder 28. That is, the solder adhesion restraining portion 18 functions to separate the soldering surface 14 from a surface of the flange 4 at the side of the terminal body 2. As a result, the solder adhesion restraining portion 18 restricts the formation of the solder fillet, thereby surely preventing the solder fillet from growing toward the upper surface of the flange 4. Accordingly, the solder adhesion region is limited to the soldering surface 14 side by the solder adhesion restraining portion 18, thereby optimizing a region where the solder 28 is adhered, i.e., a solder processing region.

Figure 2A:
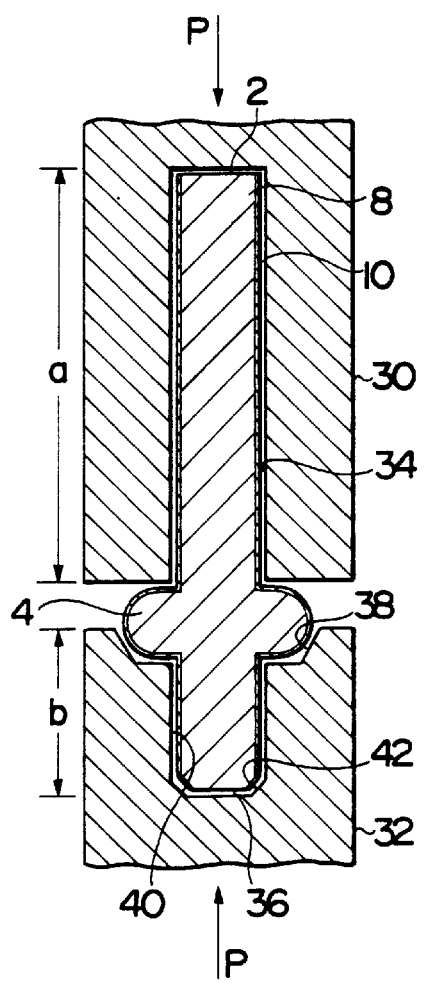
FIG. 2A is a cross-sectional view showing an initial forming process according to a method of forming the terminal of FIG. 1A.
Figure 2B:
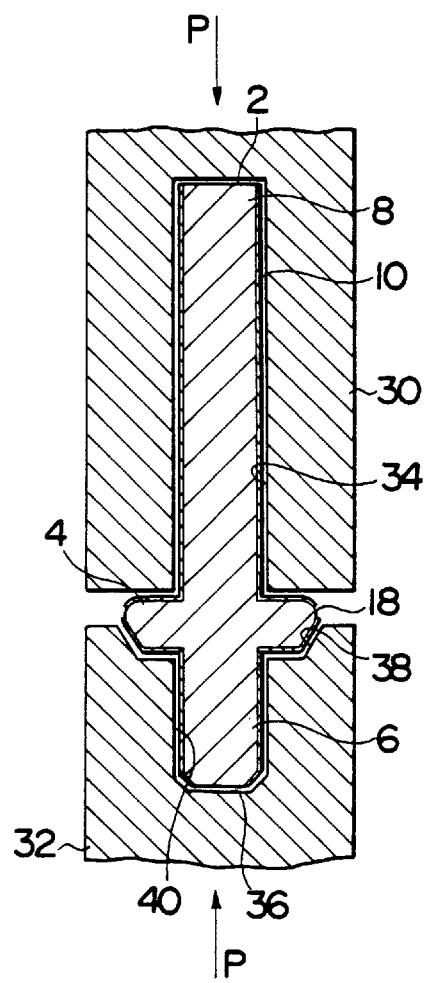
FIG. 2B is a cross-sectional view showing a middle forming process for forming the terminal of FIG. 1A.
Figure 2C:
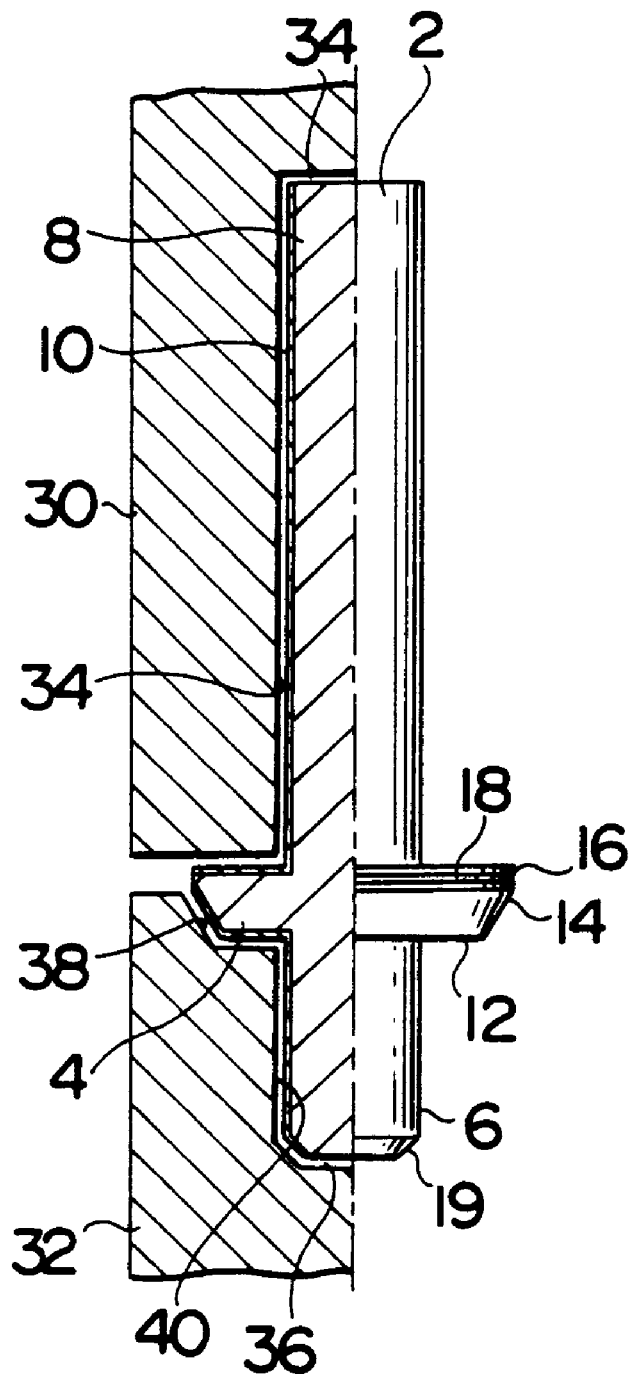
FIG. 2C is a partly cross-sectional view showing a last forming process for forming the terminal of FIG. 1A and a finished product.

FIG. 2A, FIG. 2B and FIG. 2C show a method of forming the terminal as shown in FIG. 1A.

As shown in FIG. 2A, first and second molds 30 and 32 are used for forming the terminal. A cylindrical cavity 34 corresponding to an outer diameter of the base material 8 is formed in the mold 30, and it has a height a corresponding to the height of the terminal body 2. A cavity 36 is formed in the mold 32. The cavity 36 includes a frustum-shaped first concave portion 38 having an inclined surface corresponding to the shape of the flange 4 to be molded and a second concave portion 40 corresponding to the shape of the fixing portion 6. A tapered surface 42 is formed inside the second concave portion 40. The cavity 36 has a depth b corresponding to the sum of the heights of the flange 4 and fixing portion 6.

In the molding process of the terminal, the columnar base material 8 which is previously plated with a conductor is cut in such a length that the flange 4 can be formed. After the base material 8 is inserted into the cylindrical cavities 34 and 36 of the molds 30 and 32 respectively, pressures are applied to the molds 30 and 32 in the directions of arrows P so as to compress the base material 8. When the base material 8 is compressed, a part thereof is swelled toward the first concave portion 38, thereby forming a prototype of the flange 4.

As shown in FIG. 2B, as the compressing forces P between the molds 30 and 32 are increased to narrow an interval between the molds 30 and 32, the flange 4 is formed along the shape of the first concave portion 38 and a part of the conductive plating layer 10 is cracked so as to form the solder adhesion restraining portion 18.

Figure 3:
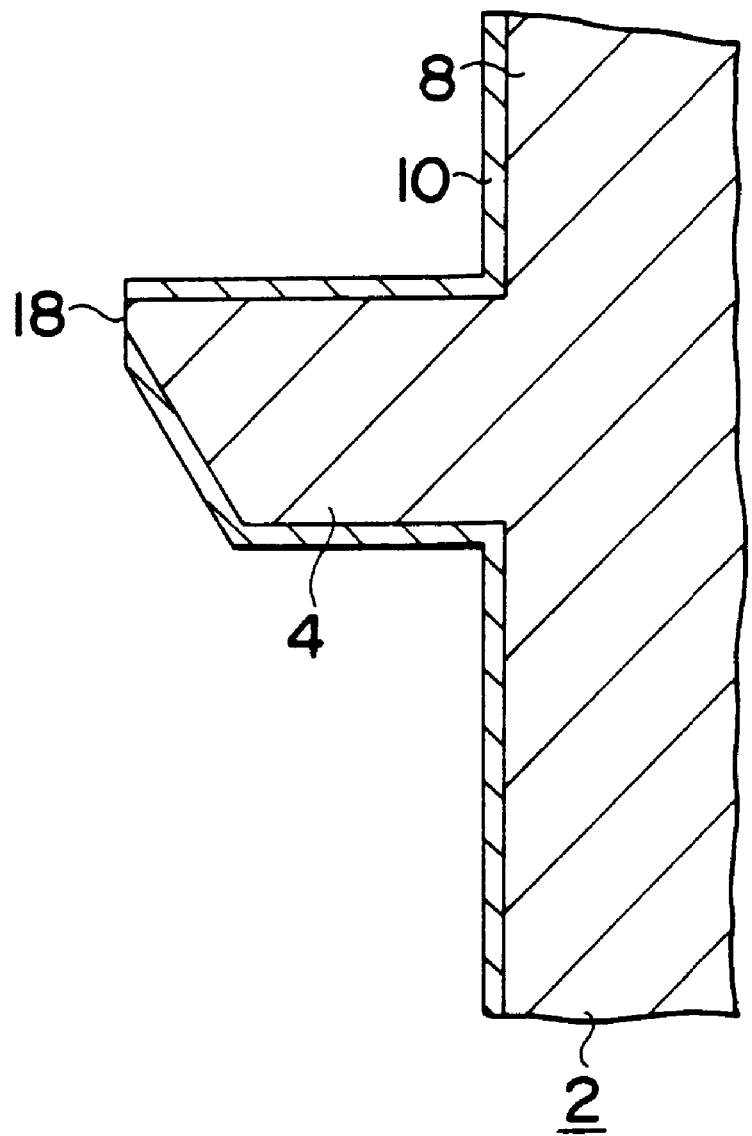
FIG. 3 is an enlarged cross-sectional view of a part of the terminal which is formed by the method of forming the terminal as shown in FIGS. 2A to 2C.

As shown in FIG. 2C and FIG. 3, when the molds 30 and 32 are brought into contact with each other by applying pressures thereto, the terminal is formed as a product. That is, the flange 4 is formed by the first concave portion 38 of the cavity 36, and the large diameter portion 16, soldering surface 14 having the inclined surface, fixing surface 12, and solder adhesion restraining portion 18 are respectively formed on the flange 4.

According to the method of forming a terminal, it is possible to form the terminal of a single base material 8 with the molds 30 and 32 easily and with high accuracy and moreover selectively form the soldering surface 14 having high solder wetting performance and the solder adhesion restraining portion 18 for limiting the solder adhesion region by partially peeling off the conductive plating layer 10 formed on the surface of the base material 8 by plating the same previously.

Figure 4:
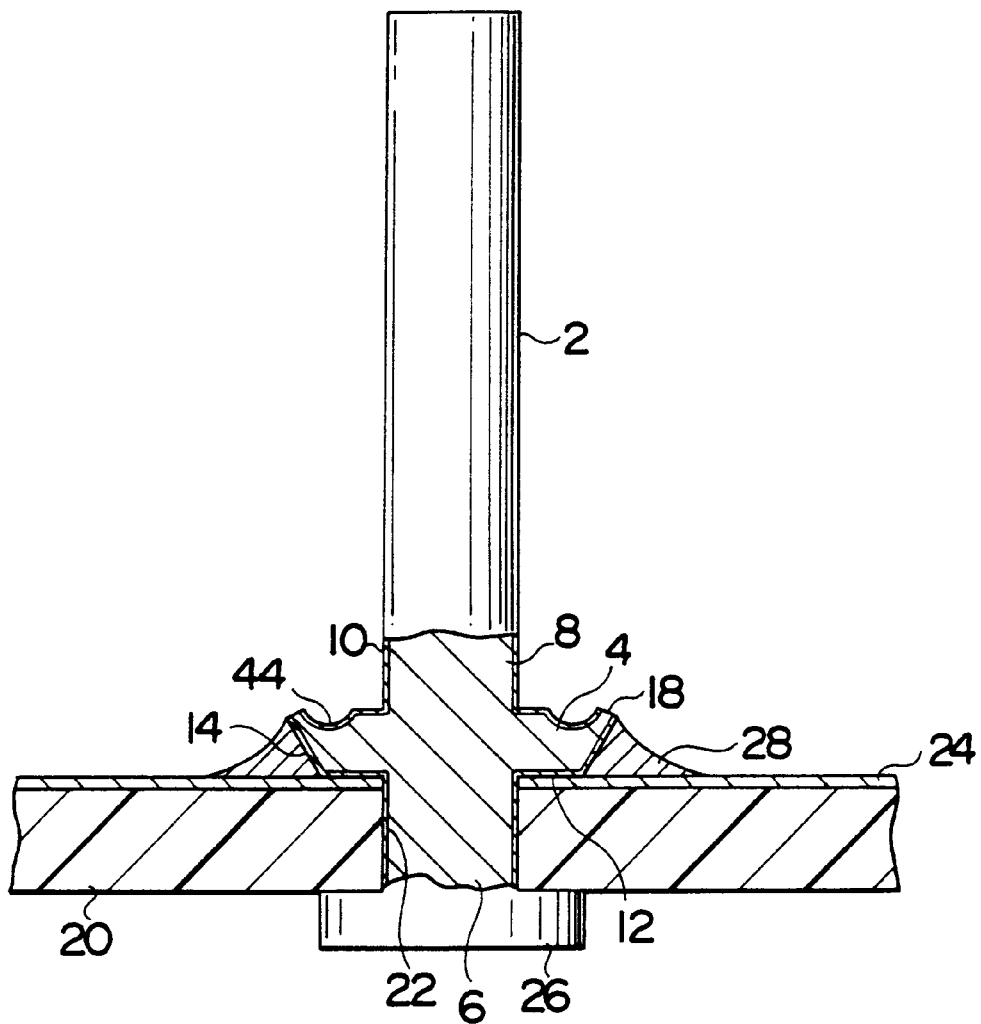
FIG. 4 is a partly cross-sectional view of a terminal according to a second embodiment of the invention to which soldering is performed.

Second Embodiment (FIG. 4 and FIG. 5A to FIG. 5C):

FIG. 4 shows a terminal according to a second embodiment of the present invention. The terminal of the second embodiment includes the solder adhesion restraining portion 18 formed on a part of the columnar large diameter portion 16 of the first embodiment, and an annular concave portion 44 formed at the upper surface of the flange 4, i.e., an surface side thereof opposite to the fixing surface 12.

With such an arrangement of the second embodiment as illustrated in FIG. 4, a region to which solder adheres is limited to the soldering surface 14, and the solder adhesion restraining portion 18 and annular concave portion 44 can surely restrain the formation of the solder fillet.

Figure 5A:
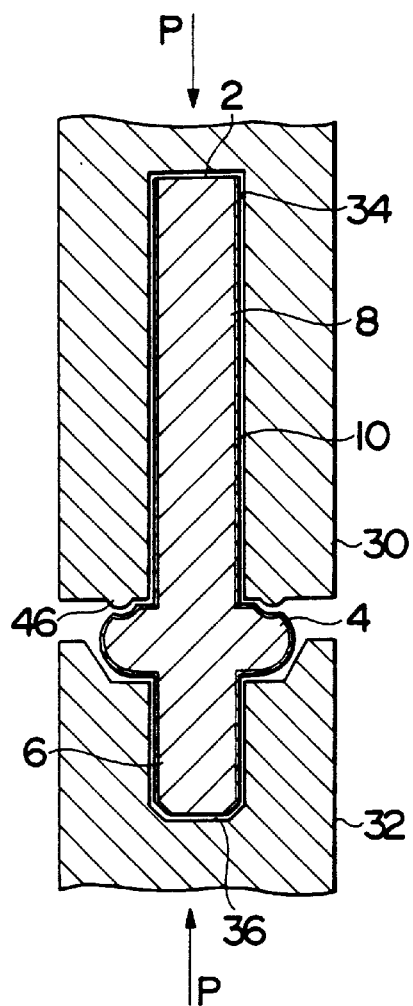
FIG. 5A is a cross-sectional view showing an initial forming process according to a method of forming the terminal of FIG. 4.
Figure 5B:
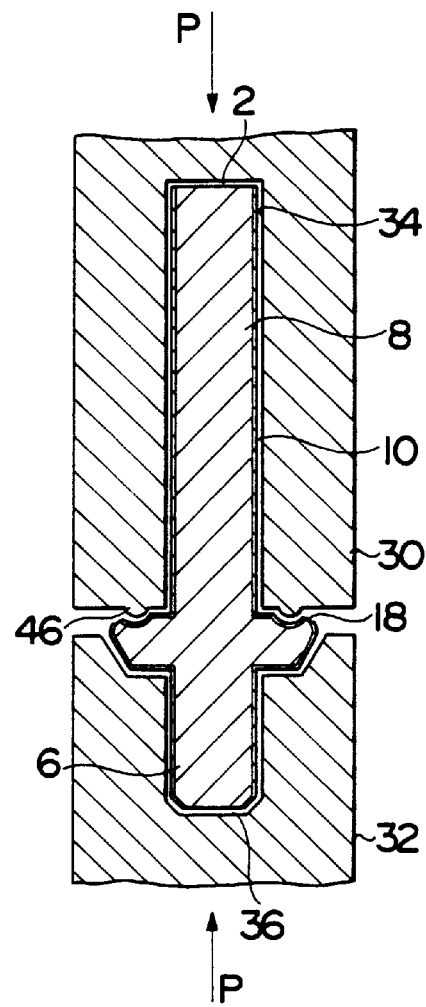
FIG. 5B is a cross-sectional view showing a middle forming process for forming the terminal of FIG. 4.
Figure 5C:
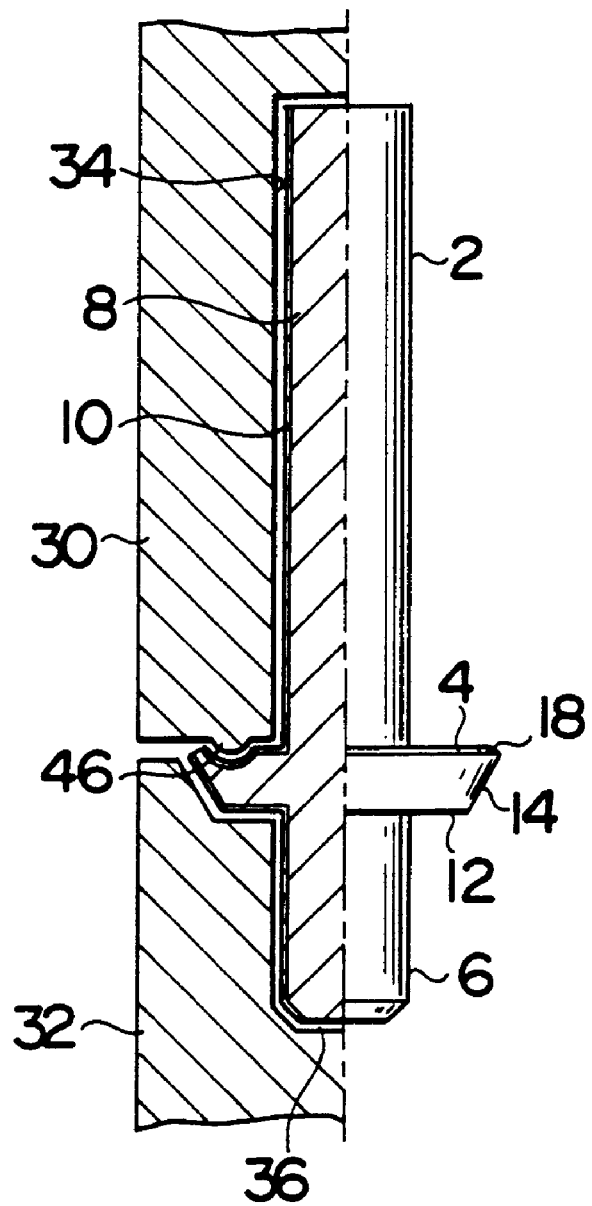
FIG. 5C is a partly cross-sectional view showing a last forming process for forming the terminal of FIG. 4 and a finished product.

FIG. 5A, FIG. 5B and FIG. 5C show a method of forming the terminal as shown in FIG. 4.

As shown in FIG. 5A, the second embodiment uses the molds 30 and 32 like the first embodiment and the shapes of the cavities 34 and 36 are substantially the same as those of the first embodiment. However, the second embodiment is different from the first embodiment in providing an annular convex portion 46 having a semicircular cross section on the lower surface of the mold 30.

A method of forming the terminal of the second embodiment is the same as that of the first embodiment as shown in FIG. 2. As shown in FIG. 5A, firstly the base material 8 is inserted into the molds 30 and 32, secondly pressures are applied thereto in the directions of arrows P so that the convex portion 46 of the mold 30 starts to enter a prototype of the flange 4, which facilitates producing cracks in the conductive plating layer 10. Accordingly, as shown in FIG. 5B, the cracks in the conductive plating layer 10, i.e., the solder adhesion restraining portion 18 grow upward from the soldering surface 14 so that it is formed together with the annular concave portion 44 on the shoulder portion of the flange 4, i.e., on the upper surface of the flange 4 as shown in FIG. 5C.

When the mold 30 described above is used, the solder adhesion region on the soldering surface 14 is enlarged compared with that of the soldering surface 14 of the first embodiment, and the solder adhesion restraining portion 18 moves to the shoulder portion of the flange 4, which results in an excellent adhesion of the solder 28 and sure prevention of the formation of the solder fillet. In a word, the formation of the annular concave portion 44 effectively produces the cracks in the conductive plating layer 10 and keeps the cracks away from the soldering surface 14, which contributes to the soldering surface 14 in preventing the same from being deteriorated in solder wetting performance.

Figure 6:
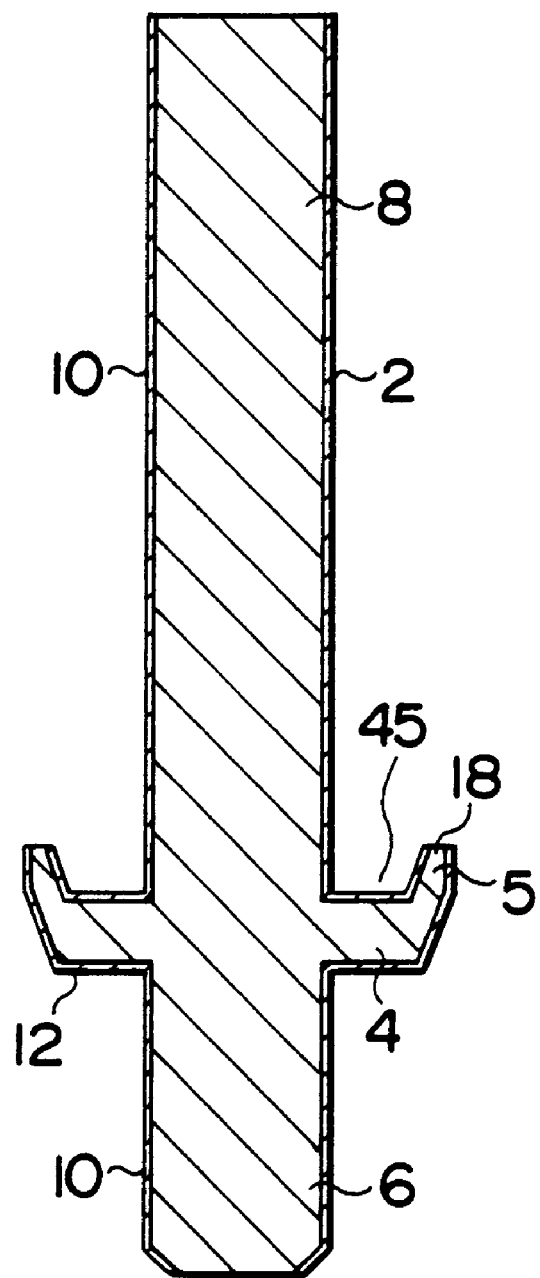
FIG. 6 is a cross-sectional view of a terminal according to a third embodiment of the present invention.

Third Embodiment (FIG. 6):

FIG. 6 shows a terminal according to a third embodiment of the present invention. According to the terminal of the second embodiment as shown in FIG. 4, the solder adhesion restraining portion 18 is formed by forming the curved annular concave portion 44 on the upper surface of the flange 4. However, in case of the terminal of the third embodiment, a rising wall portion 5 is formed on a peripheral edge portion of the flange 4 to project therefrom toward a tip end of the terminal body 2, and an annular concave portion 45 which is deeper than the annular concave portion 44 of the second embodiment is formed between the rising wall portion 5 and the upper surface of the flange 4. The solder adhesion restraining portion 18 is formed on the tip end portion of the rising wall portion 5.

With such an arrangement of the terminal, the lower and upper surfaces of the flange 4 are cut off from each other by the rising wall portion 5, so that the flow of solder is surely shut off and solder restraining effect of the solder adhesion restraining portion 18 can be more promoted.

A method of forming the terminal of the third embodiment can be achieved easily by providing the convex portion 46 on the mold 30 for forming the annular concave portion 45, namely, by permitting the convex portion 46 to have a protruding length and shape corresponding to the depth and shape of the annular concave portion 45. Further, the rising wall portion 5 can be realized by welding a ring to the terminal, the ring being an additional member to the terminal.

Figure 7:
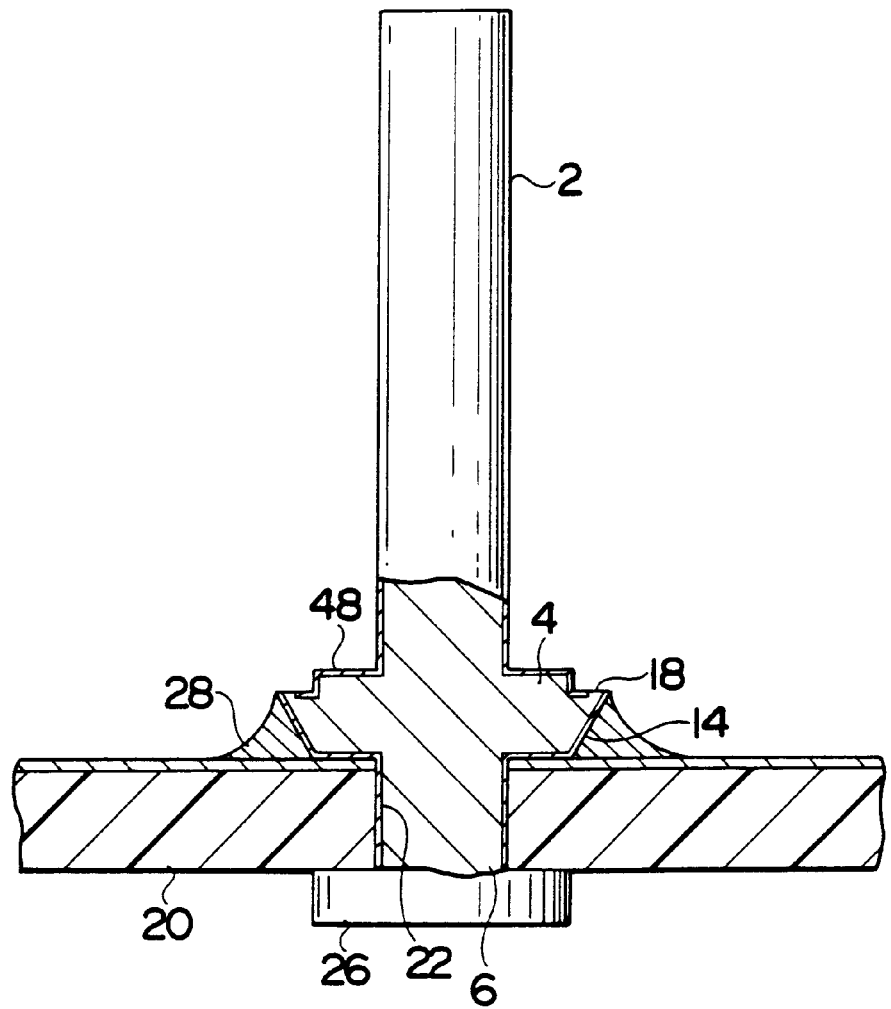
FIG. 7 is a partly cross-sectional view of a terminal according to a fourth embodiment of the invention to which soldering is performed.

Fourth Embodiment (FIG. 7 and FIG. 8A to FIG. 8C):

FIG. 7 shows a terminal according to a fourth embodiment of the present invention. In the terminal of the fourth embodiment, the solder adhesion restraining portion 18 is formed on the shoulder portion of the flange 4, and an annular step portion 48 having small diameter is formed on the upper side of the flange 4 with a difference in level between it and the solder adhesion restraining portion 18.

With such an arrangement of the terminal, the solder adhesion region of the solder 28 is limited to the soldering surface 14 and the solder adhesion restraining portion 18 and annular step portion 48 can surely restrain the formation of the solder fillet.

Figure 8A:
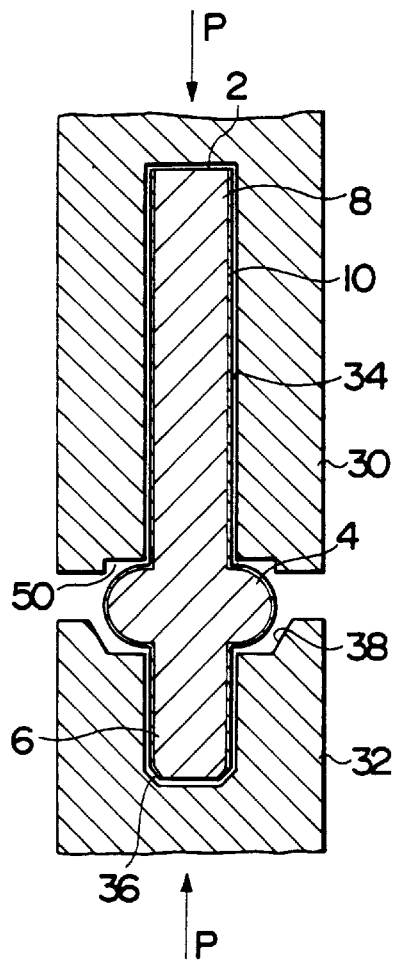
FIG. 8A is a cross-sectional view showing an initial process for forming the terminal of FIG. 7.
Figure 8B:
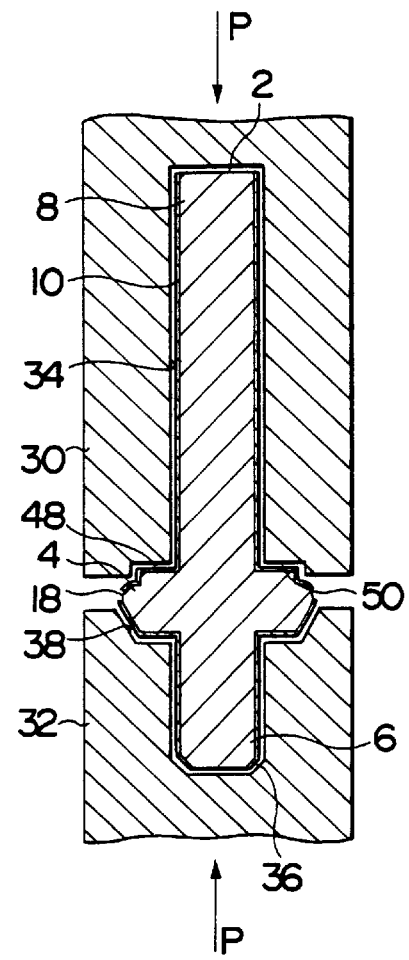
FIG. 8B is a cross-sectional view showing a middle forming process for forming the terminal as shown in FIG. 7.
Figure 8C:
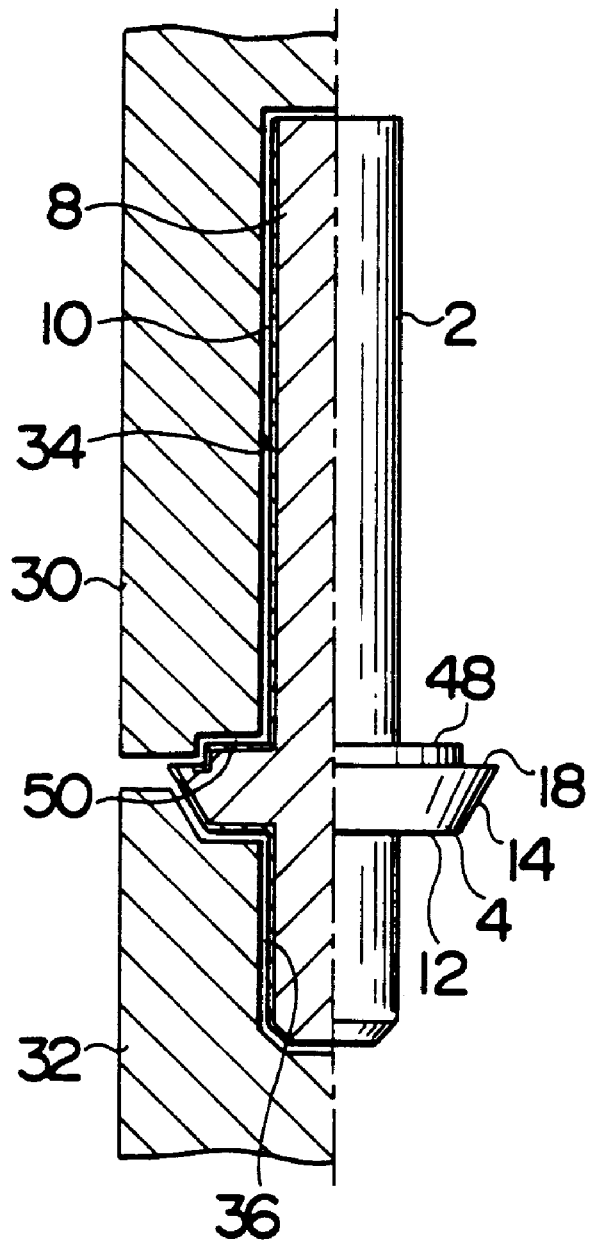
FIG. 8C is a partly cross-sectional view showing a last forming process for forming the terminal of FIG. 7 and a finished product.

FIG. 8A, FIG. 8B and FIG. 8C show a method of forming the terminal as shown in FIG. 7.

As shown in FIG. 8A, this method is the same as those of the first and second embodiments in respect of using the molds 30 and 32 but the former is different from the latter in respect of forming an annular concave portion 50 on the bottom surface of the cylindrical cavity 34 of the mold 30.

This method is the same as that of the second embodiment as shown in FIG. 4. As shown in FIG. 8A, firstly the base material 8 is inserted into the molds 30 and 32, secondly pressures are applied to the molds 30 and 32 in the directions of arrows P so that a prototype of the flange 4 is formed between the concave portion 38 and the annular concave portion 50 of the molds 30 and 32, thereafter pressures are further applied thereto so that the annular step portion 48 is formed on the upper surface of the flange 4, which facilitates the production of cracks in the conductive plating layer 10. Accordingly, as shown in FIG. 8B, the cracks in the conductive plating layer 10, i.e., the solder adhesion restraining portion 18 grows upward from the soldering surface 14 so that the solder adhesion restraining portion 18 is formed together with the annular step portion 48 on the shoulder portion of the flange 4, i.e., on the upper surface of the flange 4 as shown in FIG. 8C.

When the mold 30 described above is used, the solder adhesion region on the soldering surface 14 is enlarged compared with that of the first embodiment, and the solder adhesion restraining portion 18 moves toward the shoulder portion of the flange 4, which results in the improved adhesion of the solder 28 and the sure prevention of formation of the solder fillet. Formation of the annular step portion 48 effectively produces cracks in the conductive plating layer 10 to keep the cracks away from the soldering surface 14 and enlarge the soldering surface 14, and moreover contribute to the soldering surface 14 in preventing the same from being deteriorated in solder wetting performance.

Figure 9:
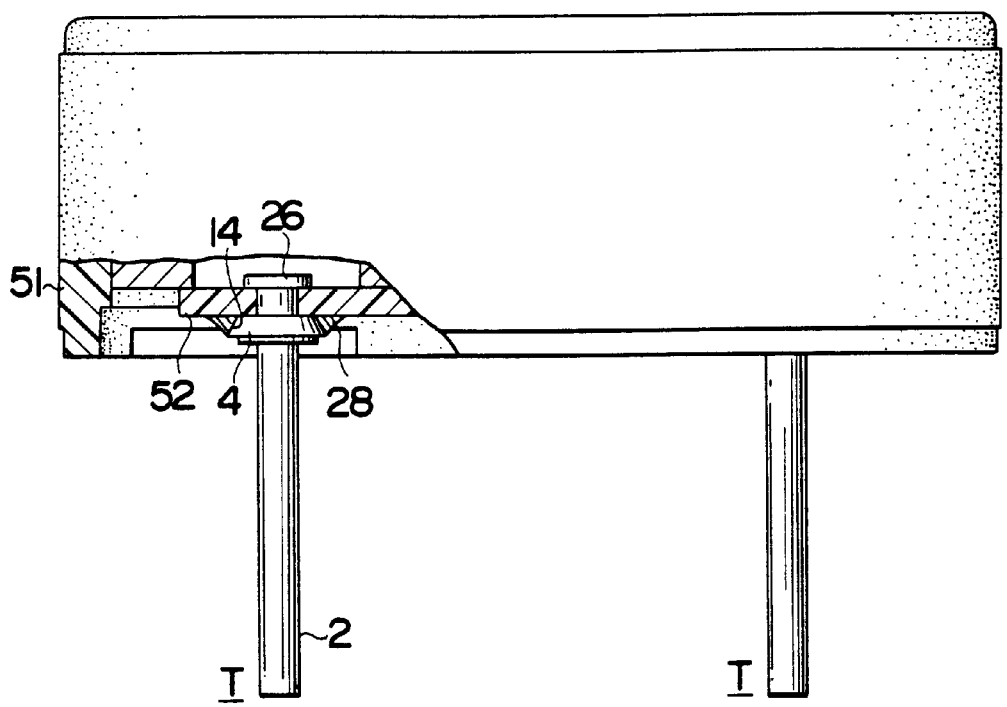
FIG. 9 is a partly cross-sectional view of an electroacoustic transducer employing terminals of the present invention.
Figure 10:
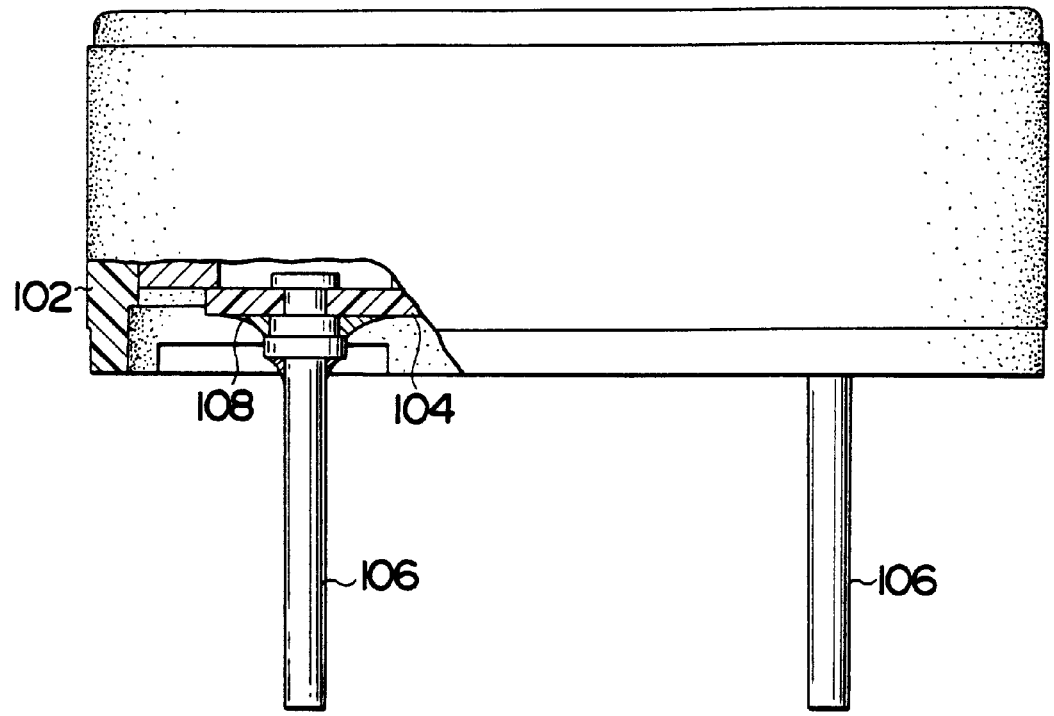
FIG. 10 is a partly cross-sectional view of an electroacoustic transducer employing prior art terminals.
Figure 12A:
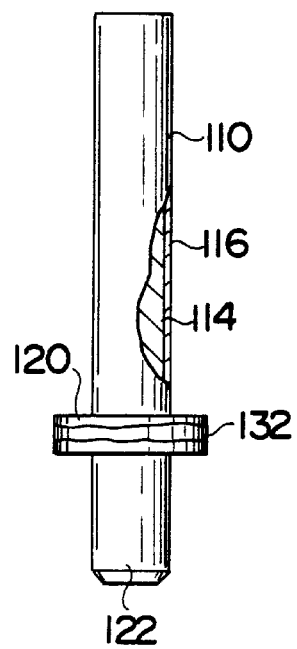
FIG. 12A is a partly cross-sectional view showing another prior art terminal.
Figure 12B:
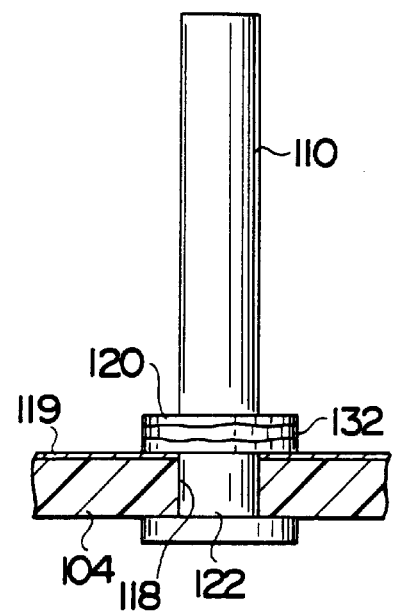
FIG. 12B is a partly cross-sectional view showing a state where the terminal is fixed to a printed board.
Figure 12C:
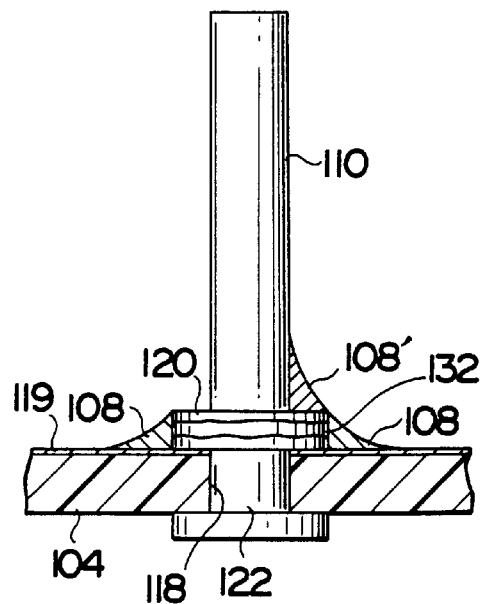
FIG. 12C is a partly cross-sectional view showing a state where the terminal is soldered and connected to the printed board.
Figure 13C:
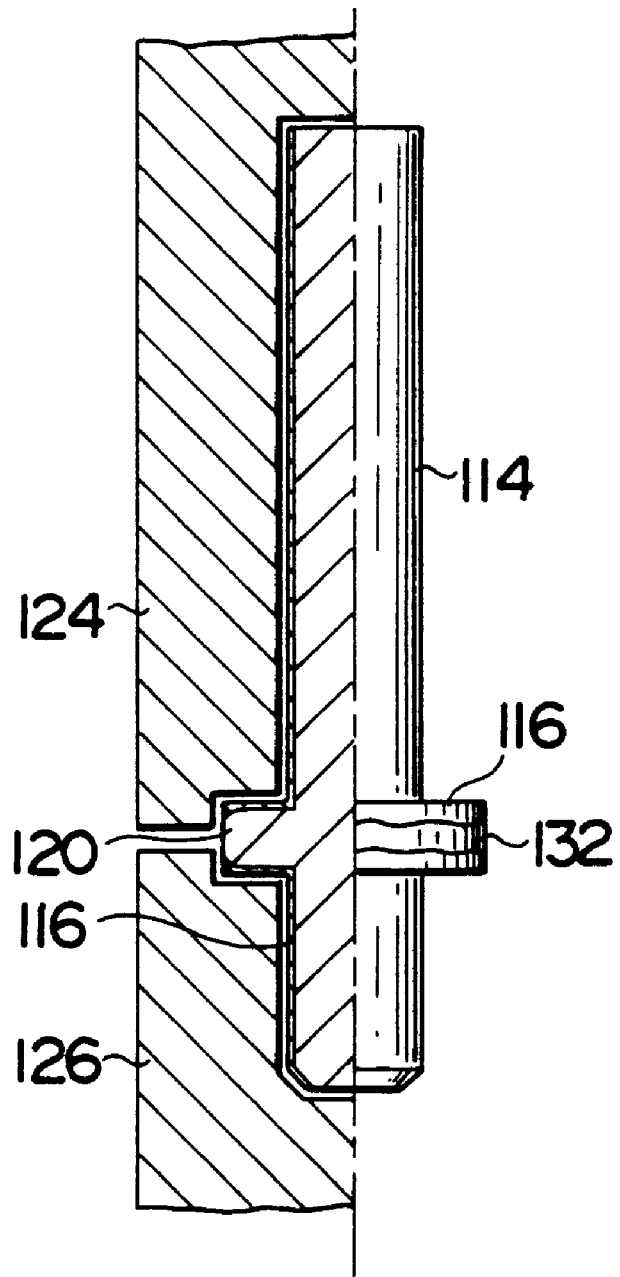
FIG. 13C is a partly cross-sectional view showing a last forming process for forming the terminal of FIG. 12A and a finished product.
Figure 15C:
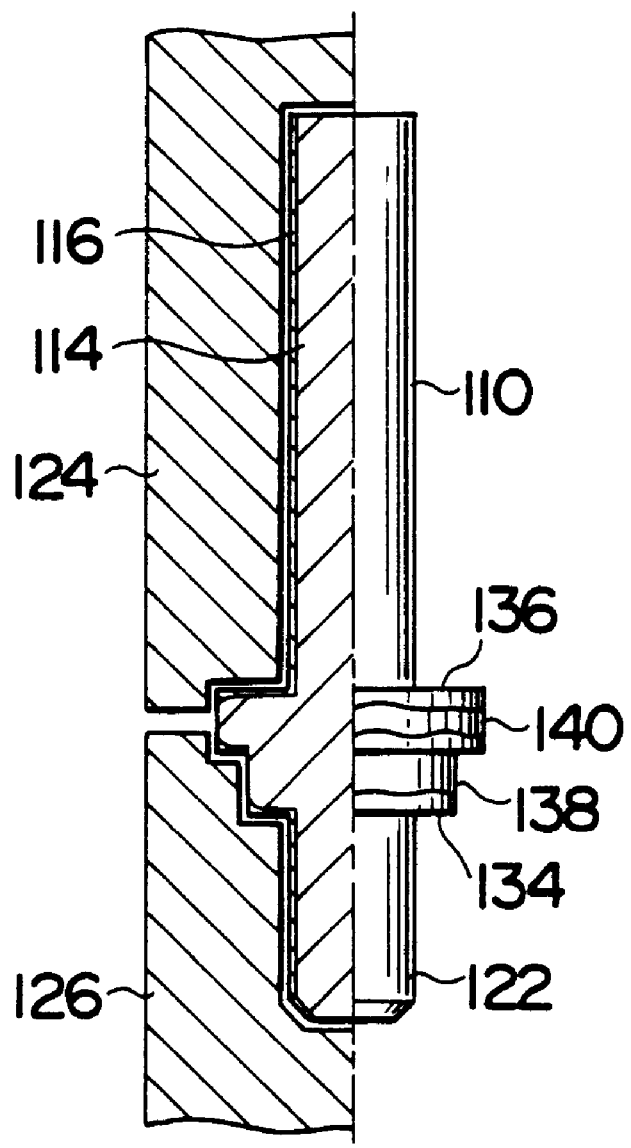
FIG. 15C is a partly cross-sectional view showing a last forming process for forming the terminal of FIG. 14A and a finished product.

FIG. 9 shows an electroacoustic transducer employing the terminals according to the present invention. The electroacoustic transducer employs the terminal as illustrated in FIG. 7.

A printed board 52 is fixed inside an outer casing 51 and terminals T are fixed to the printed board 52. The solder 28 flows between the soldering surface 14 of the flange 4 of the terminal T and the printed board 52 so as to obtain sure connection between the soldering surface 14 and the printed board 52. Further, the flange 4 is accommodated in an opening in the lower surface of the outer casing 51, and it is very small relative to the terminal body 2, which means that it contributes to the miniaturization and flattening of the electroacoustic transducer.

Although the terminal of the present invention has been explained by exemplifying that used in the electroacoustic transducer, it can be used as a terminal for a hybrid IC, various electric and electronic devices and parts thereof in a wide field of utilization, and hence they are not limited to the aforementioned embodiments and examples.

Although the soldering surface is formed of the inclined surface according to the aforementioned embodiments, they may be formed of a curved surface which is step or concave with respect to the connecting surface of the base member.

As mentioned in detail above in the above embodiments, the following effects can be obtained by the terminal and the method of forming the same according to the present invention.

a. The terminal includes the fixing portion which is provided at the end portion of the terminal body to be fixed to the base member to which the terminal is to be fixed and the flange which comprises at the peripheral portion the soldering surface confronting the connecting surface of the base member and the solder adhesion restraining portion for restraining the solder adhesion region. The solder adhesion restraining portion having low solder wetting performance is formed at a portion where the solder fillet grows to restrain the solder adhesion region, thereby optimizing the solder adhesion region and enhancing the connecting strength of solder between the terminal and the base member such as the printed board.

b. Since the flange is provided with the soldering surface inclined relative to the soldering surface of the base member such as the printed board, it is possible to sufficiently flow the solder between the terminal and the base member and assure the connection therebetween, enhance reliability of the electric and soldering connection between the terminal and the base member, and further improve the quality of the soldering connection.

c. Further, the solder adhesion region is separated by the region having low solder wetting performance, it is assured to restrain the growth of the solder fillet.

d. Since the solder adhesion region is optimized compared with the prior art terminals, it is possible to minimize the solder adhesion region, to thin or miniaturize the terminals of the electric and electronic devices and parts thereof, thereby contributing to the devices and parts thereof in thinning or miniaturizing the same.

e. According to a method of forming a terminal of the present invention, it is possible to easily form the terminal in which the solder adhesion region is optimized.

Although the characteristics of the present invention have been described with reference to various embodiments, the present invention is not limited to these embodiments but includes various modifications for achieving the object of the present invention.

What is claimed is:

1. A terminal mountable to a base member, the terminal comprising
    a terminal body;
    a fixing portion for fixing the terminal body to the base member;
    a flange to be connected to said base member by solder;
    said flange, having a surface adjacent a side of the fixing portion and another surface adjacent a side of the terminal body;
    a soldering surface formed on the surface of the fixing portion side of the flange and tapered down in a direction from the terminal body to the fixing portion;
    a solder adhesion restraining portion formed on the surface of the terminal body side of the flange, said solder adhesion restraining portion restraining an adhering region of solder to be adhered to the soldering surface;
    whereby soldering between a connecting surface of the base member and the soldering surface of the flange is optimized by restraining the adhering region of the solder by the solder adhesion restraining portion;
    wherein said flange has a concave portion formed on a generally annular outward section of the surface adjacent a side of said terminal body.

2. A terminal mountable to a base member, the terminal comprising
    a terminal body;
    a fixing portion for fixing the terminal body to the base member;
    a flange to be connected to said base member by solder;
    said flange, having a surface adjacent a side of the fixing portion and another surface adjacent a side of the terminal body;
    a soldering surface formed on the surface of the fixing portion side of the flange and tapered down in a direction from the terminal body to the fixing portion;
    a solder adhesion restraining portion formed on the surface of the terminal body side of the flange, said solder adhesion restraining portion restraining an adhering region of solder to be adhered to the soldering surface;
    whereby soldering between a connecting surface of the base member and the soldering surface of the flange is optimized by restraining the adhering region of the solder by the solder adhesion restraining portion;
    wherein said flange further includes a rising wall portion projecting upward from an upper surface of said flange toward said terminal body, and further wherein said solder adhesion restraining portion is provided at a tip end of said rising wall portion.

3. A terminal mountable to a base member, the terminal comprising
    a terminal body;
    a fixing portion for fixing the terminal body to the base member;
    a flange to be connected to said base member by solder;
    said flange, having a surface adjacent a side of the fixing portion and another surface adjacent a side of the terminal body;
    a soldering surface formed on the surface of the fixing portion side of the flange and tapered down in a direction from the terminal body to the fixing portion;
    a solder adhesion restraining portion formed on the surface of the terminal body side of the flange, said solder adhesion restraining portion restraining an adhering region of solder to be adhered to the soldering surface;
    whereby soldering between a connecting surface of the base member and the soldering surface of the flange is optimized by restraining the adhering region of the solder by the solder adhesion restraining portion;
    wherein said flange has a step portion formed on a surface thereof outwardly of said terminal body.

4. An electrical terminal for connection to a printed circuit board, the terminal comprising:
    an intermediately positioned flange having a tapered peripheral soldering surface that is transversely bounded by a larger base surface and a smaller shoulder surface, the soldering surface tapered down in a direction from the larger base surface to the smaller shoulder surface;
    a terminal connection section extending generally coaxially and orthogonally from the larger base surface;
    a terminal affixing section for retained insertion in a printed circuit board, the terminal affixing section extending oppositely from the terminal connection section and being generally coaxial and orthogonal to the smaller shoulder surface;
    a first continuous plating layer extending between the terminal affixing section, the smaller shoulder surface, and the peripheral soldering surface;
    a second continuous plating layer extending between the terminal connection section and the larger base surface; and
    a discontinuity of the plating layer forming an uneven surface at an interface between the larger base surface and the peripheral soldering surface for restraining the adhesion of solder thereon and restricting the presence of solder to the peripheral soldering surface;
    wherein the larger base surface includes an annular concave recess formed therein.

5. An electrical terminal for connection to a printed circuit board, the terminal comprising:
    an intermediately positioned flange having a tapered peripheral soldering surface that is transversely bounded by a larger base surface and a smaller shoulder surface, the soldering surface tapered down in a direction from the larger base surface to the smaller shoulder surface;
    a terminal connection section extending generally coaxially and orthogonally from the larger base surface;
    a terminal affixing section for retained insertion in a printed circuit board, the terminal affixing section extending oppositely from the terminal connection section and being generally coaxial and orthogonal to the smaller shoulder surface;
    a first continuous plating layer extending between the terminal affixing section, the smaller shoulder surface, and the peripheral soldering surface;
    a second continuous plating layer extending between the terminal connection section and the larger base surface; and a discontinuity of the plating layer forming an uneven surface at an interface between the larger base surface and the peripheral soldering surface for restraining the adhesion of solder thereon and restricting the presence of solder to the peripheral soldering surface;

the flange further comprising an annular upstanding extension of a peripheral soldering surface outer edge and an adjacent outer edge of the larger base surface;

the discontinuous uneven surface being located between the peripheral soldering surface outer edge and the adjacent outer edge of the larger base surface.

6. An electrical terminal for connection to a printed circuit board, the terminal comprising:

an intermediately positioned flange having a tapered peripheral soldering surface that is transversely bounded by a larger base surface and a smaller shoulder surface, the soldering surface tapered down in a direction from the larger base surface to the smaller shoulder surface;

a terminal connection section extending generally coaxially and orthogonally from the larger base surface;

a terminal affixing section for retained insertion in a printed circuit board, the terminal affixing section extending oppositely from the terminal connection section and being generally coaxial and orthogonal to the smaller shoulder surface;

a first continuous plating layer extending between the terminal affixing section, the smaller shoulder surface, and the peripheral soldering surface;

a second continuous plating layer extending between the terminal connection section and the larger base surface; and a discontinuity of the plating layer forming an uneven surface at an interface between the larger base surface and the peripheral soldering surface for restraining the adhesion of solder thereon and restricting the presence of solder to the peripheral soldering surface;

wherein the larger base surface has a stepped cross-section.

7. A terminal for a printed circuit base member, the terminal comprising:

a terminal body;

an integrally formed fixing portion generally coaxial with the terminal body for mounting the terminal to the printed circuit base member;

an inclined flange integrally connected between the body and the fixing portion and having a peripheral surface located in radially outward relation to the body and the fixing portion, the flange including a surface at a side of the fixing portion and another surface at a side of the terminal body and tapered down in a direction from the terminal body to the fixing portion;

a soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion;

wherein said flange has a concave portion formed on a generally annular outward section of a surface adjacent said terminal body.

8. A terminal for a printed circuit base member, the terminal comprising:

a terminal body;

an integrally formed fixing portion generally coaxial with the terminal body for mounting the terminal to the printed circuit base member;

an inclined flange integrally connected between the body and the fixing portion and having a peripheral surface located in radially outward relation to the body and the fixing portion, the flange including a surface at a side of the fixing portion and another surface at a side of the terminal body and tapered down in a direction from the terminal body to the fixing portion;

a soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion;

wherein said flange further includes a rising wall portion projecting upward from an upper surface of said flange toward said terminal body, and further wherein said solder adhesion restraining portion is provided at a tip end of said rising wall portion.

9. A terminal for a printed circuit base member, the terminal comprising:

a terminal body;

an integrally formed fixing portion generally coaxial with the terminal body for mounting the terminal to the printed circuit base member;

an inclined flange integrally connected between the body and the fixing portion and having a peripheral surface located in radially outward relation to the body and the fixing portion, the flange including a surface at a side of the fixing portion and another surface at a side of the terminal body and tapered down in a direction from the terminal body to the fixing portion;

a soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion;

wherein said flange has a step portion formed on a portion of the surface of said terminal body side.

10. A method of forming a terminal having a fixing portion for fixing a terminal body to a base member and a flange to be connected to said base member by solder, said method comprising the steps:

subjecting a base material having a conductive plating layer formed on a surface thereof to pressure molding so as to integrally form the terminal body, the flange and the fixing portion;

forming surfaces of the flange, including a surface of the fixing portion side and another surface of the terminal body side;

a downwardly tapering soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion;

wherein said flange has a concave portion formed on a generally annular outward section of a surface adjacent a side of said terminal body.

11. A method of forming a terminal having a fixing portion for fixing a terminal body to a base member and a flange to be connected to said base member by solder, said method comprising the steps:

subjecting a base material having a conductive plating layer formed on a surface thereof to pressure molding so as to integrally form the terminal body, the flange and the fixing portion;

forming surfaces of the flange, including a surface of the fixing portion side and another surface of the terminal body side;

a downwardly tapering soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion;

wherein said flange further includes a rising wall portion projecting upward from an upper surface of said flange toward said terminal body, and further wherein said solder adhesion restraining portion is provided at a tip end of said rising wall portion.

12. A method of forming a terminal having a fixing portion for fixing a terminal body to a base member and a flange to be connected to said base member by solder, said method comprising the steps:

subjecting a base material having a conductive plating layer formed on a surface thereof to pressure molding so as to integrally form the terminal body, the flange and the fixing portion;

forming surfaces of the flange, including a surface of the fixing portion side and another surface of the terminal body side;

a downwardly tapering soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion;

wherein said flange has a step portion formed on a portion of the surface of said terminal body side.

13. A method for making a printed circuit terminal having a terminal body, an integrally formed fixing portion generally coaxial with the terminal body for mounting the terminal to a printed circuit base member, and a frusto-conical flange integrally connected between the body and the fixing portion, the method comprising the steps:

subjecting a base material, having a conductive plating layer formed on a surface thereof, to pressure molding so as to integrally form the terminal body, the flange, and the fixing portion;

forming two distinctly different surface portions on a peripheral surface of the flange that is located in radially outward relation to the body and the fixing portion, and having surfaces of the flange, including a surface of the fixing portion side and another surface of the terminal body side;

a soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion; and wherein said flange further has a concave portion formed on the surface of said terminal body side.

14. A method for making a printed circuit terminal having a terminal body, an integrally formed fixing portion generally coaxial with the terminal body for mounting the terminal to a printed circuit base member, and a frusto-conical flange integrally connected between the body and the fixing portion, the method comprising the steps:

subjecting a base material, having a conductive plating layer formed on a surface thereof, to pressure molding so as to integrally form the terminal body, the flange, and the fixing portion;

forming two distinctly different surface portions on a peripheral surface of the flange that is located in radially outward relation to the body and the fixing portion, and having surfaces of the flange, including a surface of the fixing portion side and another surface of the terminal body side;

a soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion; and wherein said flange further includes a rising wall portion projecting upward from an upper surface of said flange toward said terminal body, and further wherein said solder adhesion restraining portion is provided at a tip end of said rising wall portion.

15. A method for making a printed circuit terminal having a terminal body, an integrally formed fixing portion generally coaxial with the terminal body for mounting the terminal to a printed circuit base member, and a frusto-conical flange integrally connected between the body and the fixing portion, the method comprising the steps:

subjecting a base material, having a conductive plating layer formed on a surface thereof, to pressure molding so as to integrally form the terminal body, the flange, and the fixing portion;

forming two distinctly different surface portions on a peripheral surface of the flange that is located in radially outward relation to the body and the fixing portion, and having surfaces of the flange, including a surface of the fixing portion side and another surface of the terminal body side;

a soldering surface formed on the surface of the fixing portion side of the flange;

a solder adhesion restraining portion formed on the surface of the terminal body side of the flange, said solder adhesion restraining portion restraining an adhering region of solder to be adhered to the soldering surface;

whereby soldering between a connecting surface of the base member and the soldering surface of the flange is optimized by restraining the adhering region of the solder by the solder adhesion restraining portion; and wherein said flange has a step portion formed on a portion of the surface of said terminal body side.

16. An electrical terminal for connection to a printed circuit board, the terminal comprising:

an intermediately positioned flange having a tapered peripheral soldering surface that is transversely bounded by a larger base surface and a smaller shoulder surface, the soldering surface tapered down in a direction from the larger base surface to the smaller shoulder surface;

a terminal connection section extending generally coaxially and orthogonally from the larger base surface;

a terminal affixing section for retained insertion in a printed circuit board, the terminal affixing section extending oppositely from the terminal connection section and being generally coaxial and orthogonal to the smaller shoulder surface;

a first continuous plating layer extending between the terminal affixing section, the smaller shoulder surface, and the peripheral soldering surface;

a second continuous plating layer extending between the terminal connection section and the larger base surface;

a discontinuity of the plating layer forming an uneven surface at an interface between the larger base surface and the peripheral soldering surface for restraining the adhesion of solder thereon and restricting the presence of solder to the peripheral soldering surface;

wherein said flange has a concave portion formed on the larger base surface.

17. An electrical terminal for connection to a printed circuit board, the terminal comprising:

an intermediately positioned flange having a tapered peripheral soldering surface that is transversely bounded by a larger base surface and a smaller shoulder surface, the soldering surface tapered down in a direction from the larger base surface to the smaller shoulder surface;

a terminal connection section extending generally coaxially and orthogonally from the larger base surface;

a terminal affixing section for retained insertion in a printed circuit board, the terminal affixing section extending oppositely from the terminal connection section and being generally coaxial and orthogonal to the smaller shoulder surface;

a first continuous plating layer extending between the terminal affixing section, the smaller shoulder surface, and the peripheral soldering surface;

a second continuous plating layer extending between the terminal connection section and the larger base surface; and a discontinuity of the plating layer forming an uneven surface at an interface between the larger base surface and the peripheral soldering surface for restraining the adhesion of solder thereon and restricting the presence of solder to the peripheral soldering surface;

said flange further including a rising wall portion projecting upward from the larger base surface toward the terminal connection section, and further wherein said discontinuity is provided at a tip end of said rising wall portion.

18. An electrical terminal for connection to a printed circuit board, the terminal comprising:

an intermediately positioned flange having a tapered peripheral soldering surface that is transversely bounded by a larger base surface and a smaller shoulder surface, the soldering surface tapered down in a direction from the larger base surface to the smaller shoulder surface;

a terminal connection section extending generally coaxially and orthogonally from the larger base surface;

a terminal affixing section for retained insertion in a printed circuit board, the terminal affixing section extending oppositely from the terminal connection section and being generally coaxial and orthogonal to the smaller shoulder surface;

a first continuous plating layer extending between the terminal affixing section, the smaller shoulder surface, and the peripheral soldering surface;

a second continuous plating layer extending between the terminal connection section and the larger base surface;

a discontinuity of the plating layer forming an uneven surface at an interface between the larger base surface and the peripheral soldering surface for restraining the adhesion of solder thereon and restricting the presence of solder to the peripheral soldering surface;

said flange further having a step portion formed on the larger base surface.

19. A method for making an electrical terminal for connection to a printed circuit board, the steps comprising:

deforming a blank terminal to include a) an intermediately positioned flange having a tapered peripheral soldering surface that is transversely bounded by a larger base surface and a smaller shoulder surface, the soldering surface tapered down in a direction from the larger base surface to the smaller shoulder surface;

b) a terminal connection section extending coaxially and orthogonally from the larger base surface; and c) a terminal affixing section for retained insertion in a printed circuit board, the terminal affixing section extending oppositely from the terminal connection section and being coaxial and orthogonal to the smaller shoulder surface;

stressing a continuous plating layer of the terminal to cause disruption thereof, resulting in d) a first continuous plating layer extending between the terminal affixing section, the smaller shoulder surface, and the peripheral soldering surface;

e) a second continuous plating layer extending between the terminal connection section and the larger base surface;

f) a discontinuity of the plating layer forming an uneven surface at an interface between the larger base surface and the peripheral soldering surface for restraining the adhesion of solder thereon and restricting the presence of solder to the peripheral soldering surface; and g) wherein said flange has a concave portion formed on the larger base surface.

20. A method for making an electrical terminal for connection to a printed circuit board, the steps comprising:

deforming a blank terminal to include a) an intermediately positioned flange having a tapered peripheral soldering surface that is transversely bounded by a larger base surface and a smaller shoulder surface, the soldering surface tapered down in a direction from the larger base surface to the smaller shoulder surface;

b) a terminal connection section extending coaxially and orthogonally from the larger base surface; and c) a terminal affixing section for retained insertion in a printed circuit board, the terminal affixing section extending oppositely from the terminal connection section and being coaxial and orthogonal to the smaller shoulder surface;

stressing a continuous plating layer of the terminal to cause disruption thereof, resulting in d) a first continuous plating layer extending between the terminal affixing section, the smaller shoulder surface, and the peripheral soldering surface;

e) a second continuous plating layer extending between the terminal connection section and the larger base surface; and f) a discontinuity of the plating layer forming an uneven surface at an interface between the larger base surface and the peripheral soldering surface for restraining the adhesion of solder thereon and restricting the presence of solder to the peripheral soldering surface;

g) said flange further including a rising wall portion projecting upward from the larger base surface toward the terminal connection section, and further wherein said discontinuity is provided at a tip end of said rising wall portion.

21. A method for making an electrical terminal for connection to a printed circuit board, the steps comprising:

deforming a blank terminal to include a) an intermediately positioned flange having a tapered peripheral soldering surface that is transversely bounded by a larger base surface and a smaller shoulder surface, the soldering surface tapered down in a direction from the larger base surface to the smaller shoulder surface;

b) a terminal connection section extending generally coaxially and orthogonally from the larger base surface; and c) a terminal affixing section for retained insertion in a printed circuit board, the terminal affixing section extending oppositely from the terminal connection section and being generally coaxial and orthogonal to the smaller shoulder surface;

stressing a continuous plating layer of the terminal to cause disruption thereof, resulting in d) a first continuous plating layer extending between the terminal affixing section, the smaller shoulder surface, and the peripheral soldering surface;

e) a second continuous plating layer extending between the terminal connection section and the larger base surface; and f) a discontinuity of the plating layer forming an uneven surface at an interface between the larger base surface and the peripheral soldering surface for restraining the adhesion of solder thereon and restricting the presence of solder to the peripheral soldering surface;

g) said flange further having a step portion formed on the larger base surface.

* * * * *